(12) United States Patent
Schäffter et al.

(10) Patent No.: US 6,741,882 B2
(45) Date of Patent: May 25, 2004

(54) MR DEVICE AND MR METHOD FOR LOCALIZING AND/OR VISUALIZING A MEDICAL INSTRUMENT PROVIDED WITH A PASSIVE MAGNET DEVICE

(75) Inventors: Tobias Schäffter, Hamburg (DE); Steffen Weiss, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 421 days.

(21) Appl. No.: 09/729,587

(22) Filed: Dec. 4, 2000

(65) Prior Publication Data

US 2001/0040449 A1 Nov. 15, 2001

(30) Foreign Application Priority Data

Dec. 2, 1999 (DE) .......................... 199 58 408

(51) Int. Cl.[7] ................................................. A61B 5/05
(52) U.S. Cl. ........................................ 600/424; 128/899
(58) Field of Search ................................ 600/410, 411, 600/420, 424; 128/899; 604/528; 324/200

(56) References Cited

U.S. PATENT DOCUMENTS

| 4,989,608 | A | * | 2/1991 | Ratner ........................ 600/420 |
| 5,257,636 | A | * | 11/1993 | White ........................ 128/897 |
| 5,271,400 | A | * | 12/1993 | Dumoulin et al. .......... 600/410 |
| 5,622,169 | A | * | 4/1997 | Golden et al. .............. 600/424 |
| 5,951,472 | A | * | 9/1999 | Van Vaals et al. .......... 600/411 |
| 6,263,230 | B1 | * | 7/2001 | Haynor et al. .............. 600/424 |
| 6,522,909 | B1 | * | 2/2003 | Garibaldi et al. ........... 600/424 |

FOREIGN PATENT DOCUMENTS

EP           0928972 A2     7/1999    ........... G01R/33/28

* cited by examiner

Primary Examiner—Kennedy Schaetzle
(74) Attorney, Agent, or Firm—John Vodopia

(57) ABSTRACT

The invention relates to an MR device with apparatus for localizing and/or visualizing a medical instrument inserted into an object to be examined. In order to construct such a device in a more economical and more reliable manner, according to the invention, the medical instrument is provided with a magnet device which is controllable by a control unit in such a manner that information concerning the position of the magnet device in MR data sets can be specifically changed. The invention also relates to a corresponding MR method.

9 Claims, 1 Drawing Sheet

MR DEVICE AND MR METHOD FOR LOCALIZING AND/OR VISUALIZING A MEDICAL INSTRUMENT PROVIDED WITH A PASSIVE MAGNET DEVICE

BACKGROUND OF THE INVENTION

The invention relates to an MR device with means for localizing and/or visualizing a medical instrument inserted into an object to be examined, as well as to a corresponding MR method.

A device and a method of this kind are known from EP 928 972 A2. The cited document describes a microcoil which is attached to a medical instrument, for example a catheter, inserted into the object to be examined, for example the body of a patient. The microcoil does not have any connection leads and is tuned to the MR frequency of the MR device. In response to an RF pulse, the magnetic field locally increases in the direct vicinity of the microcoil, with the result that the nuclear magnetization at the area of the microcoil is influenced to a different degree in comparison with that in the remainder of the examination zone; this difference can be made visible in an MR image and the position of the microcoil, and hence also of the medical instrument, can be deduced therefrom.

The known device, however, has been found to have a drawback in that a microcoil with a resonant circuit must be integrated in the medical instruments; this increases the cost of the instruments which are usually used only once. Moreover, the field increase caused by the microcoil often is not strong enough to enable exact determination of the position of the medical instrument, because the volume in which such a field increase occurs is comparatively small.

OBJECTS AND SUMMARY OF THE INVENTION

Therefore, it is an object of the present invention to realize a more economical and more reliable MR device and MR method of the kind set forth.

This object is achieved by means of an MR device means for at least one of localizing and visualizing a medical instrument inserted into an object to be examined, the medical instrument is provided with a magnet device and that the magnet device can be controlled by means of a control unit in such a manner that information concerning the position of the magnet device in MR data sets can be changed in a specific manner; and an MR method least one of localizing and visualizing a medical instrument inserted into an object to be examined, wherein the medical instrument is provided with a magnet device whereby information concerning the position of the magnet device in MR data sets to be acquired can be changed in a specific manner and that the magnet device is controlled by means of a control unit in such a manner that for the localization and/or visualization of the medical instrument there is acquired an MR data set which contains information concerning the position of the magnet device and otherwise MR data sets without information, or with changed information, concerning the position of the device are acquired.

The invention is based on the recognition of the fact that it would be very advantageous if the effect realized in an MR data set by means of the microcoil in the known device could be deliberately controlled, for example, that it can be switched on and off. This is not possible in the known device, because the microcoil does not have a connection lead to the environment. Granted, MR devices are known in which such a microcoil is provided with an RF lead to a receiver via which the RF signals can be transferred. It has been found, however, that such known MR devices have a serious drawback since excess fields and hence so-called "hot spots" may occur along such RF leads; such hot spots cannot be described in a model and hence represent a risk to the patient that cannot be ignored. Moreover, solutions of this kind are comparatively expensive.

Therefore, in accordance with the invention the medical instrument is provided with a passive magnet device which can be controlled from the outside without an RF lead being fed out. Such a magnet device enables control as to if and to what extent information concerning the position of the magnet device is contained in an MR data set, for example in a projection or a slice image through the magnet device. For example, the magnet device can be controlled in such a manner that the information concerning the position of the magnet device is contained in a first MR data set so that the magnet device is clearly reproduced in a first MR image whereas no information concerning the position of the magnet device is contained in a second, directly subsequently acquired MR data set of the same anatomy, so that the magnet device is not visible either in an MR image formed from the second MR data set. Thus, a third MR data set that contains exclusively the information concerning the position of the magnet device can be derived from the difference between said two MR data sets; the position of the medical instrument can be derived from said third MR data set so as to be reproduced in an MR image in conformity with an advantageous embodiment of the invention.

The orientation and/or the position of the magnet device relative to the medical instrument can be changed by means of the control unit in a preferred embodiment of the invention. This enables, for example, the successive acquisition of two MR data sets of the same anatomy while changing only the orientation and/or the position of the magnet device but not the position of the medical instrument. A third MR data set which does not contain information concerning the anatomy but only information concerning the magnet device can then be derived again from the difference between the two MR data sets.

In an alternative embodiment of the invention the magnetic properties of the magnet device can be modified. This can be realized in a further embodiment in which the magnetic properties can be modified under the influence of mechanical pressure, temperature, light or magnetic or electric radiation. MR data sets with different information contents concerning the position of the magnet device can again be derived therefrom for use in the described manner.

The control commands for the control unit are advantageously integrated in the MR sequences for the control of the MR device and for the acquisition of the MR data sets, so that the control of the magnet device is automatic during the acquisition of the MR data sets. Thus, it is not necessary for the user to perform special operations or to input data so as to initiate the determination of the position of the medical instrument. In the known MR device, however, the user would have to change the position of the medical instrument, including the microcoil, by hand and hence perform an active operation, in order to acquire two MR data sets wherefrom the position of the microcoil could be determined. The control of the magnet device and the associated acquisition of the MR data sets according to the invention is automatic and realized by way of a program.

The invention thus offers a solution for the determination of the position of a medical instrument in an object to be examined so as to visualize it in an MR image while using comparatively simple and inexpensive means that nevertheless offer a high degree of reliability.

BRIEF DESCRIPTION OF THE DRAWING FIGS

The invention will be described in detail hereinafter with reference to the drawings. Therein:

DETAILED DESCRIPTION OF THE INVENTION

Figure 1:
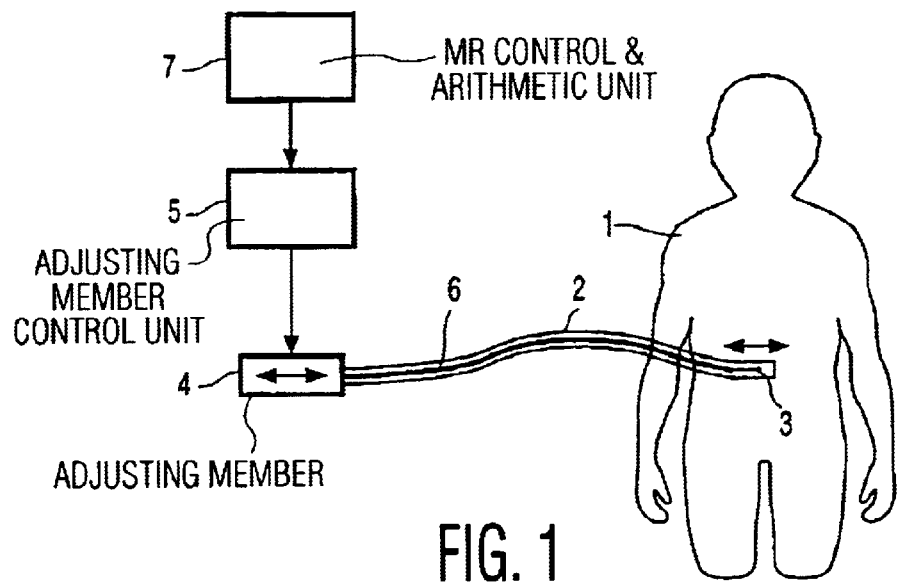
FIG. 1 shows a circuit diagram of a first embodiment of the invention.

FIG. 1 shows a case involving a first embodiment of the invention where a catheter is inserted into the body of a patient 1 and a flexible spindle 6 is arranged in the lumen of said catheter. At the tip of the spindle there is provided a passive magnet device 3, for example, a small ferrimagnetic particle 3 (for example, of dysprosium), a very small ferromagnetic particle, or a small quantity of MR contrast medium, whose position or orientation within the catheter 2 can be varied from the outside without it being necessary for the catheter 2 to move relative to the body of the patient 1. To this end, the spindle 6 is arranged so as to be freely rotatable as well as movable to and fro within the lumen of the catheter 2. The end of the spindle 6 that is remote from the body projects from the end of the catheter 2 that is remote from the body; at that area there is provided an adjusting member 4 which is capable of rotating and moving the spindle to and fro within the catheter 2. The adjusting member 4 is, for example, an electromagnet, an electric motor or another adjusting member that can be externally controlled by a separate control unit 5 which itself receives control commands from the MR control and arithmetic unit 7 that controls the entire MR system.

Figure 2:
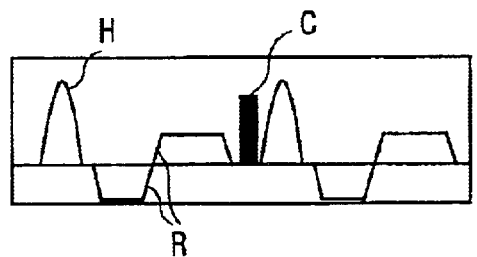
FIG. 2 shows an MR sequence configured in conformity with the invention.

For the control of the adjusting member 4 the MR sequences also include (see FIG. 2), in addition to the customary commands for the RF coils (excitation pulse H) and the gradient coils (for example, read-out gradients R), control commands C for the adjusting member 4. The control commands C are used to vary the position or orientation of the particle 3 during the acquisition of the MR data sets and to produce at least two MR data sets which contain corresponding susceptibility artefacts in different locations or with a different appearance. Finally, the position of the particle 3, and hence the position of the catheter 1, is extracted by suitable data processing of such MR data sets, for example, by subtraction of the two MR data sets. In this context the MR data sets may be either complete MR images or also only a few projection measurements along different axes in space. Such data processing can be performed directly in the MR control and arithmetic unit 7, so that the position of the catheter 2 is not only made known to the user, but is also available to the MR device for other purposes, for example, in order to track the path traveled by the catheter or to acquire constantly an MR image in a slice extending perpendicularly to the direction of movement of the catheter and through the catheter tip.

The steps according to the invention do not necessitate a special construction or modification of the catheter 2 but can be implemented with simple means. The MR control and arithmetic unit 7 need merely be capable of converting the control commands C inserted in the MR sequence into appropriate control signals for the control unit 5 or also directly for the adjusting member 4; in many MR systems in practical use this facility is already provided for other purposes.

Instead of a magnet device in the form of a single particle 3 provided at the tip of the spindle 6, it is also possible to provide a plurality of such particles on the spindle 6 at fixed distances from one another. These particles should be made of a material which makes the particles clearly visible in an MR image or an MR data set or renders such particles clearly distinct from the anatomy.

The spindle 6, together with the particles 3 and the adjusting member 4, can be removed from the catheter 6 when the lumen of the catheter 2 is to be used for other purposes; they can also be refitted at any time in order to localize the catheter 2 again. Both operations can be performed while the catheter 2 is present in the body of the patient 1.

Figure 3:
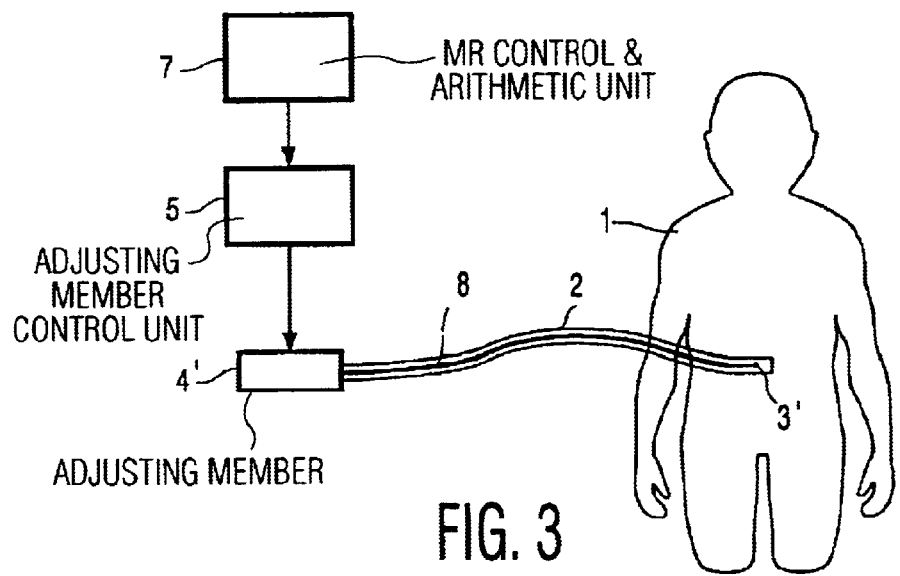
FIG. 3 shows a circuit diagram of a second embodiment of the invention.

Whereas a mechanical connection (spindle 6) exists between the adjusting member 4 and the magnet device 3 in the embodiment shown in FIG. 1, the magnet K device 3' is connected to the adjusting member 4' via an electrical connection lead 8 in the alternative embodiment of the invention which is shown in FIG. 3. The magnet device is constructed as an element 3' whose magnetic properties can be controlled from the outside by means of an adjusting member 4'. The element 3' is again arranged on the part of the catheter 2 that is inserted into the body of the patient and can be controlled by way of control commands via the connection lead; to this end, however, it is not necessary to transport RF signals or RF pulses via the connection lead, so that a very high resistance connection lead can be used and, unlike in the known devices, there is no risk of burns in the object to be examined.

The element 3" should notably be constructed in such a manner that its magnetic properties, for example the strength of the magnetic field generated in the vicinity of the element 3', can be controlled from the outside by means of pressure, light, temperature, electrical signals or electromagnetic radiation or another influencing variable. A deliberate variation of such magnetic properties is used for distinct reproduction of the element 3, or the catheter 2 itself when the element 3' is distributed across a large part of the catheter 2, in MR data sets or MR images so as to be used for the visualization and localization of the catheter in the described manner.

An embodiment of the element 3' is formed by a small coil which is fed with a current produced by the element 4' via high resistance connection leads 8, so that the coil generates in its immediate vicinity a magnetic field that causes a local signal variation in the measured MR data set.

What is claimed is:
1. An MR device comprising:
   a medical instrument configured to be inserted into an object to be examined, the medical instrument including a magnet device;
   means for at least one of localizing and visualizing the medical instrument within MR data sets, said means including means for acquiring the MR data sets; and
   a control unit for controlling a characteristic of the magnet device, wherein the acquiring means acquires information relating to a position of the magnet device in the MR data sets that can be changed in a controlled manner in response to the control unit controlling the characteristic of the magnet device.

2. The MR device as claimed in claim 1, wherein the control unit controls at least one of an orientation and a position of the magnet device relative to the medical instrument.

3. The MR device as claimed in claim 1, wherein the control unit controls magnetic properties of the magnet device, the magnetic properties including susceptibility.

4. The device as claimed in claim 3, further wherein the control unit controls the magnetic properties of the magnet device under the influence of at least one selected from the group consisting of: mechanical pressure, temperature, light, electromagnetic radiation, and electric signals.

5. The MR device as claimed in claim 1, wherein the means for at least one of localizing and visualizing the medical instrument includes an MR controller, the MR controller configured to control the MR device and the acquisition of the MR data sets in response to MR sequences, wherein the MR sequences include control commands for the control unit, wherein responsive to the control commands, the control unit automatically controls the characteristic of the magnet device during the acquisition of the MR data sets.

6. The MR device as claimed in claim 1, wherein the the control unit further controls the characteristic of the magnet device in a manner wherein information relating to the position of the magnet device in the MR data sets to be acquired by said acquiring means can be one selected from the group consisting of: switched on, switched off, and changed.

7. The MR device as claimed in claim 1, wherein the means for at least one of localizing and visualizing the medical instrument further includes an MR control unit, the MR control unit configured to control the acquisition of the MR data sets, wherein the MR control unit acquires a first MR data set in response to the magnet device control unit controlling the magnet device in a first control position of the magnet device and wherein the MR control unit acquires a second MR data set in response to the magnet device control unit controlling the magnet device in a second control position of the magnet device, and further wherein the MR control unit determines the position of the medical instrument from a difference between the first and second MR data sets.

8. The MR device as claimed in claim 1, wherein the control unit couples to the magnet device via at least one of a mechanical and an electrical connection between the control unit and the magnet device in order for the control unit to control the magnet device.

9. An MR method for at least one of localizing and visualizing a medical instrument inserted into an object to be examined, said method comprising:

provided providing a medical instrument with a magnet device;

acquiring information in a controlled manner relating to a position of the magnet device in MR data sets; and controlling by means of a control unit a characteristic of the magnet device for the at least one of the localization and visualization of the medical instrument, wherein acquiring information in a controlled manner includes acquiring an MR data set which contains information relating to the position of the magnet device in response to control of the characteristic of the magnet device by the control unit and acquiring at least one selected from the group consisting of (i) MR data sets without information relating to the position of the magnet device and (ii) MR data sets with changed information relating to the position of the magnet device in response to control of the characteristic of the magnet device by the control unit.

\* \* \* \* \*